(12) United States Patent
Matsuno

(10) Patent No.: US 6,437,370 B1
(45) Date of Patent: Aug. 20, 2002

(54) IMAGE SENSOR STRUCTURE AND MANUFACTURING PROCESS THEREFOR

(75) Inventor: Fumihiko Matsuno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/503,176

(22) Filed: Feb. 14, 2000

(30) Foreign Application Priority Data

Feb. 12, 1999 (JP) .............................. 11-034635

(51) Int. Cl.⁷ .................... H01L 31/0392; H01L 29/786
(52) U.S. Cl. ........................ 257/72; 257/59; 257/458
(58) Field of Search ..................................... 257/59, 72

(56) References Cited

U.S. PATENT DOCUMENTS 5,435,608 A * 7/1995 Wei et al. ..................... 257/72

FOREIGN PATENT DOCUMENTS

| JP | A 2-238667 | 9/1990 |
|---|---|---|
| JP | A 5-41512 | 2/1993 |
| JP | A 8-64795 | 3/1996 |

* cited by examiner

*Primary Examiner*—Gene M. Munson
(74) *Attorney, Agent, or Firm*—Young & Thompson

(57) ABSTRACT

The present invention is directed to an image sensor comprising a thin film transistor on a transparent substrate, the first interlayer film covering the thin film transistor, a photodiode as a photodetector on the first interlayer film and the second interlayer film on the photodiode and the first interlayer film, where the first and the second interlayer films are made of different materials and at least a contact hole to the element consisting of polysilicon in the thin film transistor is formed after removing the second interlayer film around the area where contact holes are to be formed.

5 Claims, 9 Drawing Sheets

PRIOR ART

PRIOR ART

PRIOR ART

IMAGE SENSOR STRUCTURE AND MANUFACTURING PROCESS THEREFOR

BACKGROUND OF THE INVENTION

1. Field of the Invention

This invention relates to an image sensor where a thin film transistor (hereinafter, referred to as "TFT") such as a switching element and a photodiode (hereinafter, referred to as "PD") as a photodetector are formed on a single substrate.

2. Description of the Related Art

In an image scanner or facsimile, an image sensor is incorporated for detecting a reflected light from an original surface by which a light is irradiated on an original. An image sensor generally has a configuration in which pixels are disposed in line, each of which consists of a PD made of amorphous silicon (a-Si) as a photodetector and an analogue switch, i.e., a polysilicon TFT. FIG. 3 is a schematic plan view of a pixel in such an image sensor. As shown in the figure, a single TFT is formed to one PD. The PD is connected to a bias line 41 via the TFT, while a gate is connected to a scanning circuit (not shown). Charge generated in each PD is temporally stored in its junction capacitance, and is chronologically read as an electric signal via a signal readout line 42 by driving a switching device by the TFT, at a rate of several hundred kHz to several hundred MHz. In such a TFT driving type of image sensor, reading can be conducted with a single driving IC owing to TFT operation, and thus the number of driving ICs for driving an image sensor may be reduced.

In such an image sensor in which TFTs and PDs are formed in sequence, it is necessary to form the PDs with a thickness of at least one-micron meter for sufficient sensitivity. An insulating film covering the PDs, therefore, must have a thickness of at least 200 nm in the light of its coverage.

Conventionally, such an image sensor has been manufactured by, for example, the procedure shown in FIGS. 5(a) to (k). The cross section in the description below is one taken on line A–A' in FIG. 3.

Specifically, on a transparent insulating substrate is deposited a polysilicon film 1 with a thickness of 50 to 100 nm by an appropriate technique such as CVD; the film is patterned according to a TFT channel shape by photolithography; and on the film is deposited a gate oxide film 2 with a thickness of 50 to 100 nm (FIG. 5(a)). Alternatively, a polysilicon film may be formed by crystallizing an a-Si by laser annealing, which has been separately formed by CVD.

Then, on the film is deposited a layered structure consisting of a polysilicon or metal film and a silicide film as a gate electrode 3 with a thickness of about 100 to 300 nm, which is then similarly patterned (FIG. 5(b)).

Then, ion doping is conducted for forming source-drain region 4 while phosphorous (P) and boron (B) ions are introduced at given doses for n- and p-types, respectively (FIG. 5(c)).

Subsequently, an $SiO_2$ film as first interlayer film 5 is deposited by CVD with a thickness of 200 to 500 nm, covering the whole surface (FIG. 5(d)).

On first interlayer film 5 is formed lower electrode 6 in a PD, made of a metal such as Cr with a thickness of 100 nm, and it is then patterned into a desired shape (FIG. 5(e)).

On the surface is formed by CVD a p-i-n type of a-Si layer 7 with a thickness of 1 μm consisting of n-, i- and p-layers from the bottom. On the layer are sequentially formed ITO layer 8 as a transparent electrode with a thickness of 100 nm and barrier metal layer 9 such as tungsten silicide with a thickness of 50 to 100 nm (FIG. 5(f)), and then barrier metal layer 9, ITO layer 8 and a-Si layer 7 are patterned by photolithography into the shape of PD 10 (FIG. 5(g)).

On the surface is formed an $Si_3N_4$ film as a second interlayer film 11 by CVD with a thickness of about 200 to 500 nm (FIG. 5(h)). As described above, since a-Si layer 7 in PD 10 has a thickness of about 1 μm, it is necessary to form the insulating film covering the PD with a thickness of 200 nm in the light of its coverage.

Then, contact holes 12 are formed, reaching source-drain region 4 for the TFT, gate electrode 3, lower electrode 6 in the PD and barrier film 9, the upper layer in the PD (FIG. 5(i)). Subsequently, a metal 13 such as Al is deposited to a thickness of 500 to 1000 nm, which is then etched into a desired interconnection shape (FIG. 5(j)). Finally, on the surface is deposited an $Si_3N_4$ film or organic film such as polyimide as a passivation film 14 with a thickness of 1 μm or less, to form an image sensor as shown in FIG. 5(k).

When forming the contact holes 12 in the step shown in FIG. 5(i), the second interlayer film 11 and the first interlayer 5 are sequentially etched. It is necessary to strictly control etching conditions for forming such deep contact holes. Furthermore, the base layer is inevitably damaged because it is extremely difficult to control an etching endpoint. In particular, during forming a contact hole to a polysilicon layer such as the source-drain region 4, etching damage to the polysilicon may significantly deteriorate device properties. During removing the first interlayer film 5 on the TFT, the PD may be over-etched, which may affect metal films such as the lower electrode 6 in the PD and the barrier film 9 to some extent.

Thus, the interconnections in the TFT and the PD may be separately formed for avoiding forming such a deep contact hole. FIGS. 6 ((a) to (g)) is a process cross-section showing the procedure.

First, a TFT is formed and then the first interlayer film 5 is deposited as described above (FIG. 6(a)). Then, the interconnection layer 13a a for the TFT is formed (FIG. 6(b)), and on the interconnection layer 13a is formed the third interlayer film 15 such as a silicon oxide film with a thickness of about 200 to 500 nm.

Then, the lower electrode 6 (FIG. 6(d)) for the PD and the PD 10 (FIG. 6(e)) are formed as described above. Subsequently, the second interlayer film 11 is formed, covering the whole surface as described above (FIG. 6(f)), and finally the interconnection layer 13b for the PD is formed (FIG. 6(g)).

Thus, interconnection layers for the TFT and the PD may be separately formed for avoiding damage to the base layer during forming contact holes. It, however, requires two interconnection-forming steps, leading to a complicated process.

SUMMARY OF THE INVENTION

An objective of this invention is to provide an uncomplicated process for manufacturing an image sensor where damage to a base layer is minimized during forming a contact hole, as well as an image sensor structure prepared thereby.

This invention which can solve the above problems provides an image sensor comprising a thin film transistor on a transparent substrate, the first interlayer film covering the thin film transistor, a photodiode as a photodetector on the first interlayer film and the second interlayer film on the photodiode and the first interlayer film, where the first and the second interlayer films are made of different materials and at least a contact hole to the element consisting of polysilicon in the thin film transistor is formed after removing the second interlayer film around the area where contact holes are to be formed.

In particular, it is preferable that the contact hole formed by removing the second interlayer film is for a source-drain region or the source-drain region and a gate electrode, and the second interlayer film is removed over the whole surface of the thin film transistor or over the whole surface of the thin film transistor and an area sufficient to expose a part of the lower electrode in the photodiode. It is more preferable that the first and the second interlayer films are a silicon oxide film and a silicon nitride film, respectively.

This invention also provides a process for manufacturing an image sensor, comprising the steps of (1) forming a thin film transistor on a transparent substrate, (2) forming the first interlayer film covering the thin film transistor, (3) forming a photodiode as a photodetector on the first interlayer film, (4) forming the second interlayer film made of a different material from that for the first interlayer film, on the photodiode and the first interlayer film, (5) removing the second interlayer film at least around the area where are to be formed contact holes to the elements consisting of polysilicon in the thin film transistor, (6) forming contact holes in the first interlayer film exposed in the area where the contact holes are to be formed, after removing the second interlayer film and (7) forming interconnection layers for the thin film transistor and the photodiode.

In particular, a preferable aspect of this invention is the process described above wherein a contact hole for connecting an interconnection layer to the second interlayer film is formed while forming a contact hole in the first interlayer film exposed in the area where the second interlayer film has been removed for forming the contact hole, and wherein the first and the second interlayer films are adjusted in their thickness according to the etching rates for the first and the second interlayer films by the etchant used during forming the contact holes to the first and the second interlayer films.

Another preferable aspect of this invention is the process described above wherein a contact hole for connecting an interconnection layer to the second interlayer film while removing the second interlayer film around the area where are to be formed contact holes to the elements consisting of polysilicon in the thin film transistor.

This invention can provide an image sensor structure with reduced damage to the base polysilicon without complicating the manufacturing process.

DETAILED DESCRIPTION OF THE PREFERRED EMBODIMENTS

The preferred embodiments of this invention will be specifically described with reference to the process cross-section in FIGS. 1((a) to (k)).

Figure 1A:
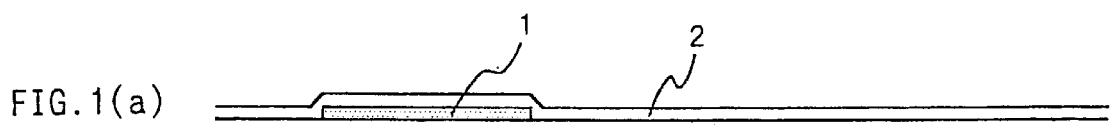
FIGS. 1((a) to (k)) is a process cross-section illustrating a process for manufacturing an image sensor according to an embodiment of this invention.
Figure 1B:
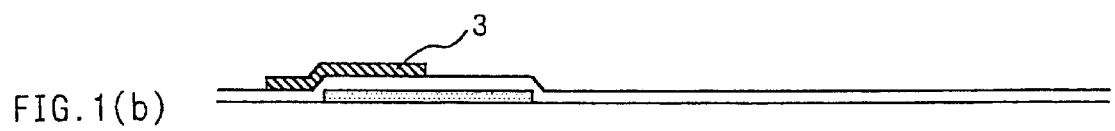

On a transparent substrate is deposited a polysilicon film 1 with a thickness of 50 to 100 nm by an appropriate technique such as CVD; the film is patterned according to a TFT channel shape by photolithography; and on the film is deposited a gate oxide film 2 with a thickness of 50 to 100 nm (FIG. 1(a)).

Then, on the film is deposited a layered structure consisting of a polysilicon or metal film and a silicide film as a gate electrode 3 with a thickness of about 100 to 300 nm, which is then patterned as described above (FIG. 1(b)).

Figure 1C:
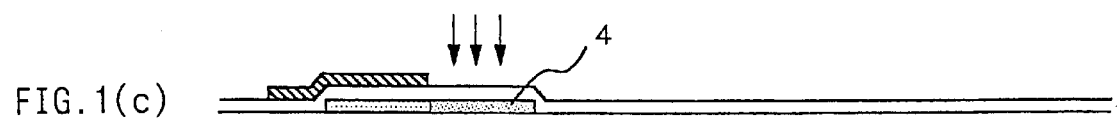
Figure 1D:
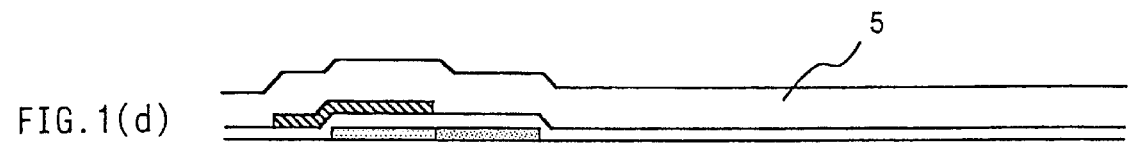

Then, ion doping is conducted for forming a source-drain region 4 while phosphorous (P) and boron (B) ions are introduced at given doses for n- and p-types, respectively (FIG. 1(c)) Subsequently, an $SiO_2$ film as the first interlayer film is deposited by CVD with a thickness of 200 to 500 nm, covering the whole surface (FIG. 1(d)).

Figure 1E:
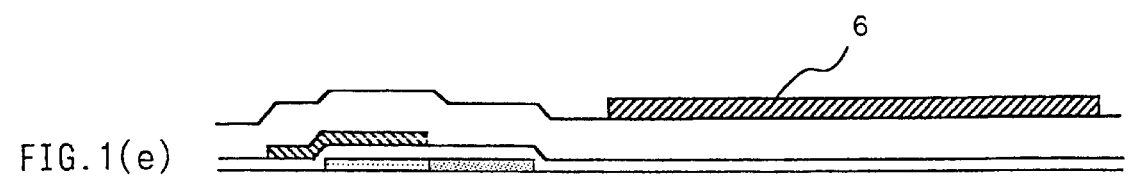
Figure 1F:
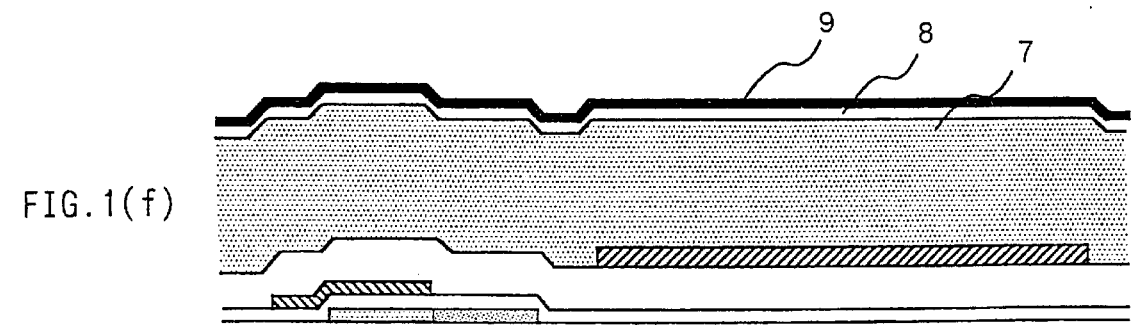
Figure 1G:
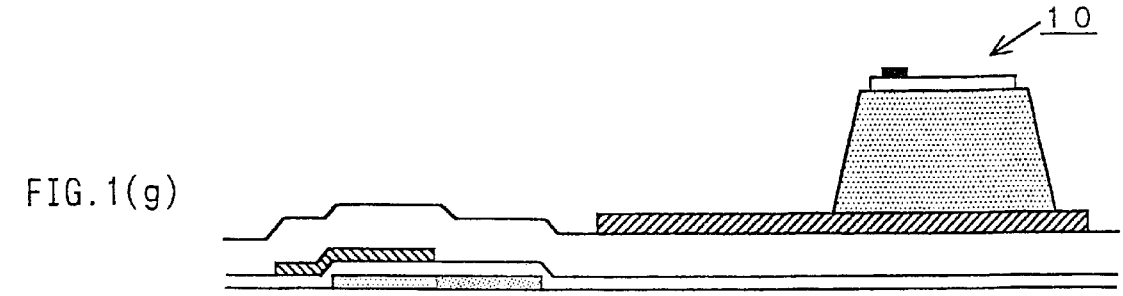

On the first interlayer film 5 is formed a lower electrode 6 in a PD, made of a metal such as Cr with a thickness of 100 nm, and it is then patterned into a desired shape (FIG. 1(e)).

On the surface is formed by CVD a p-i-n type of a-Si layer 7 with a thickness of 1 $\mu$m consisting of n-, i- and p-layers from the bottom. On the layer are sequentially formed an ITO layer 8 as a transparent electrode with a thickness of 100nm and a barrier metal layer 9 such as tungsten silicide with a thickness of 50 to 100 nm (FIG. 1(f)), and then the barrier metal layer 9, the ITO layer 8 and the a-Si layer 7 are patterned by photolithography into the shape of the PD 10 (FIG. 1(g)).

Figure 1H:
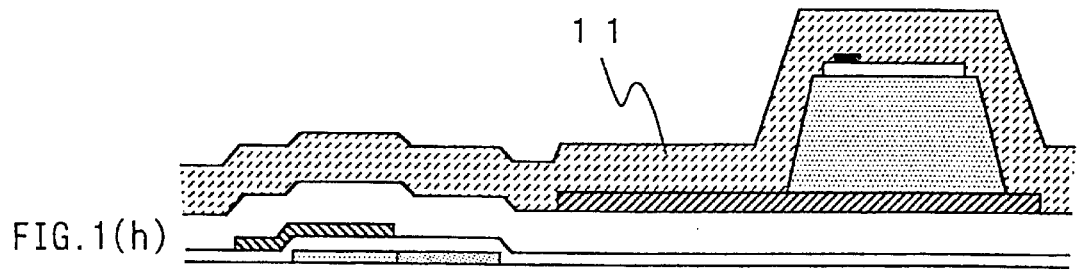

On the surface is formed an $Si_3N_4$ film as the second interlayer film 11 by CVD with a thickness of about 200 to 500 nm (FIG. 1(h)). Since the a-Si layer 7 in the PD has a thickness of about 1 $\mu$m, it is necessary to form the second interlayer film 11 with a thickness of 200 nm or more for adequate coverage.

Figure 1I:
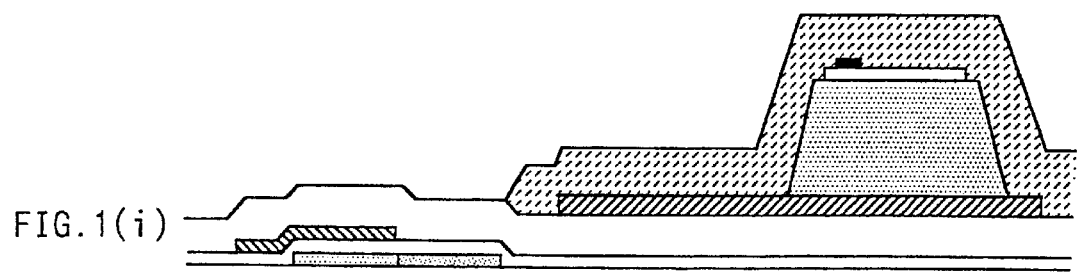

Then, the second interlayer film on the TFT is etched off (FIG. 1(i)). During the etching, for removing only the second interlayer film 11, a nitride film, without damaging the first interlayer film 5, an oxide film, etchants for the dry etching are $CF_4$ and $O_2$. The etchant mixture ratio may be optimized to increase the selection ratio between the oxide and the nitride films, to selectively remove the second interlayer film 11, a nitride film, without damaging the first interlayer film 5, an oxide film.

Figure 1J:
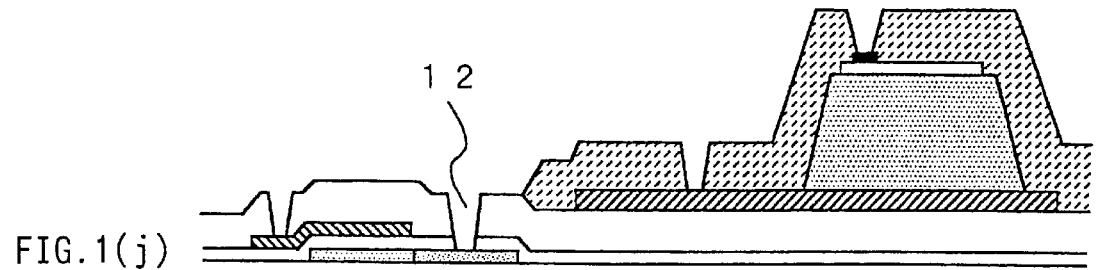
Figure 1K:
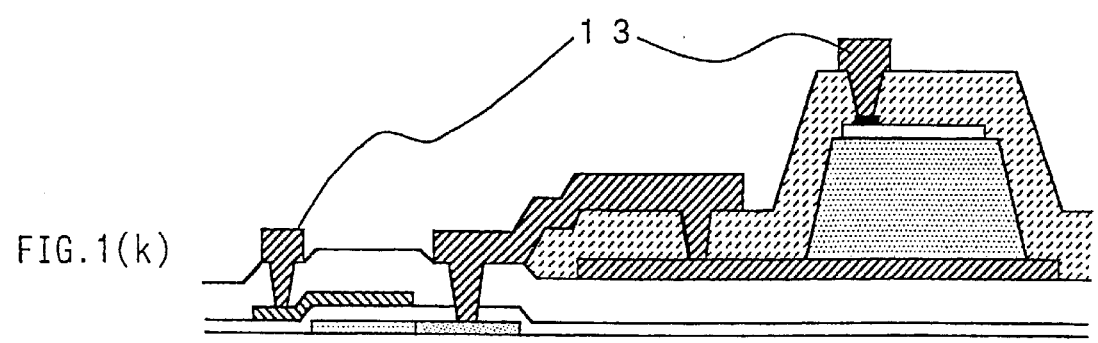

Then, dry etching is conducted using $CF_4$ and $H_2$ as etchants in an appropriate mixture ratio to form contact holes 12 to the source-drain region in the TFT, the gate electrode and the lower and the upper electrodes in the PD, i.e., the contact holes in the first and the second interlayer films are simultaneously formed (FIG. 1(j)). It is preferable that the etching rate between the oxide and the nitride films is determined and that the thickness ratio between the combination of the first interlayer and the gate insulating films and the second interlayer film is adjusted to be the same as the above etching rate ratio before deposition. For example, when the etching rate ratio between the oxide and the nitride films is 4:5 and the second interlayer film 11, a nitride film, has a thickness of 500 nm, the first interlayer film 5, an oxide film, and the gate oxide film 2 may be formed with a total thickness of 400 nm. Subsequently, a metal such as Al is deposited with a thickness of 500 to 1000 nm, which is then etched into a desired interconnection shape (FIG. 1(k)). Finally, on the surface is deposited an $Si_3N_4$ film or organic film such as polyimide as a passivation film 14 with a thickness of 1 μm or less, to form an image sensor.

Although the second interlayer film is removed over the whole surface of the TFT in the above embodiment, it may be adequate to remove the area having a larger radius than that of the contact hole to the TFT by about the thickness of the insulating film to be removed (0.3 to 0.5 μm). Alternatively, the second interlayer film 11 may be removed to expose a part of the lower electrode 6 in the PD. Exposing the lower electrode 6 and then connecting the lower electrode in the PD to the drain region via the interconnection layer 13 can eliminate the step of forming a contact hole to the lower electrode 6.

Figure 2A:
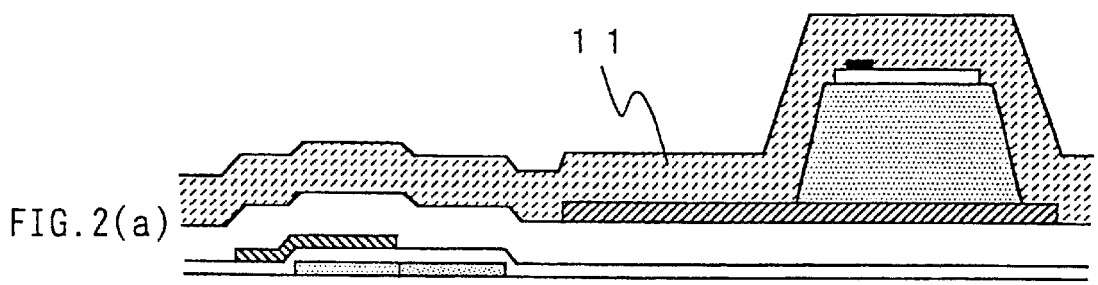
FIGS. 2((a) to (d)) is a process cross-section illustrating a process for manufacturing an image sensor according to another embodiment of this invention.
Figure 2B:
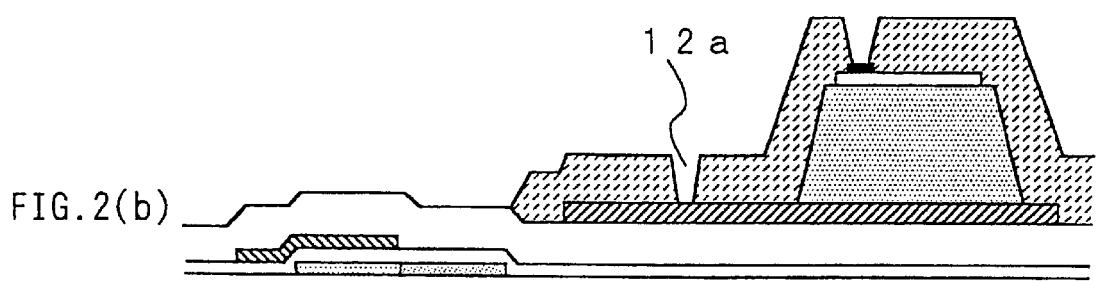

In another embodiment of this invention, the second interlayer film may be removed while forming a contact hole to the second interlayer film; a contact hole may be selectively formed to the first interlayer film exposed in the area where the second interlayer film has been removed; and the interconnections may be simultaneously formed in the contact holes formed in the first and the second interlayer films. Specifically, in the substrate for which the steps to formation of the second interlayer film 11 have been completed as described above (FIG. 2(a)), a contact hole 12a to the PD is formed in the second interlayer film 11 by dry-etching using $CF_4$ and $O_2$ as etchants as described above while removing the second interlayer film 11 over the TFT, as illustrated in FIG. 2(b).

Figure 2C:
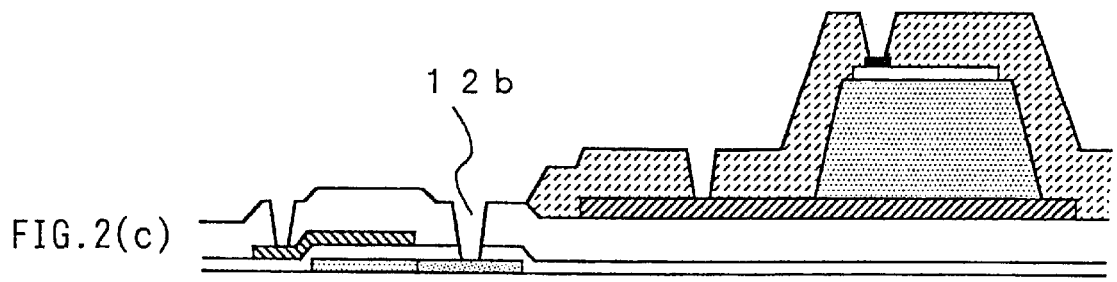

Then, as illustrated in FIG. 2(c), dry etching is conducted while covering the areas except for the area where a contact hole 12b is to be formed, with a mask, to form the contact hole 12b to the first interlayer film. It is preferable to use $CF_4$ and $H_2$ as etchants in such a mixture ratio that a selection ratio between the oxide film and polysilicon is increased, for further minimizing damage to the base polysilicon. Thus, forming the contact holes to the first and the second interlayer films 5 and 11 in separate steps may eliminate the necessity for adjusting a thickness for both films as described in the first embodiment, allowing a design to be more flexible.

Figure 2D:
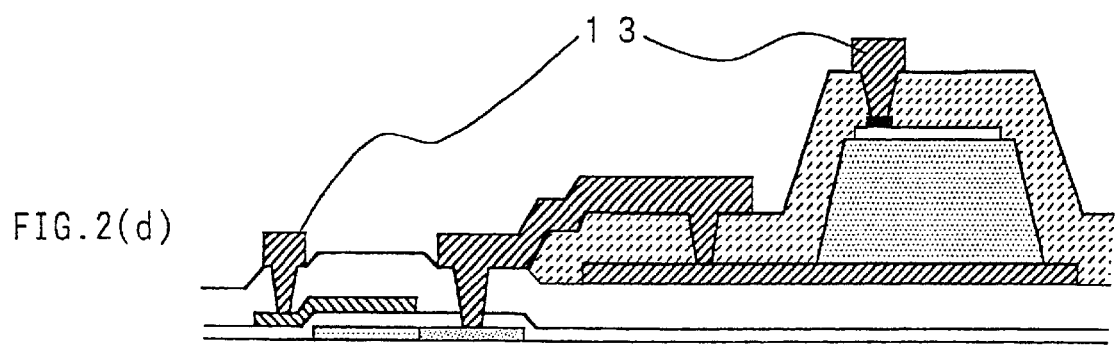
Figure 3:
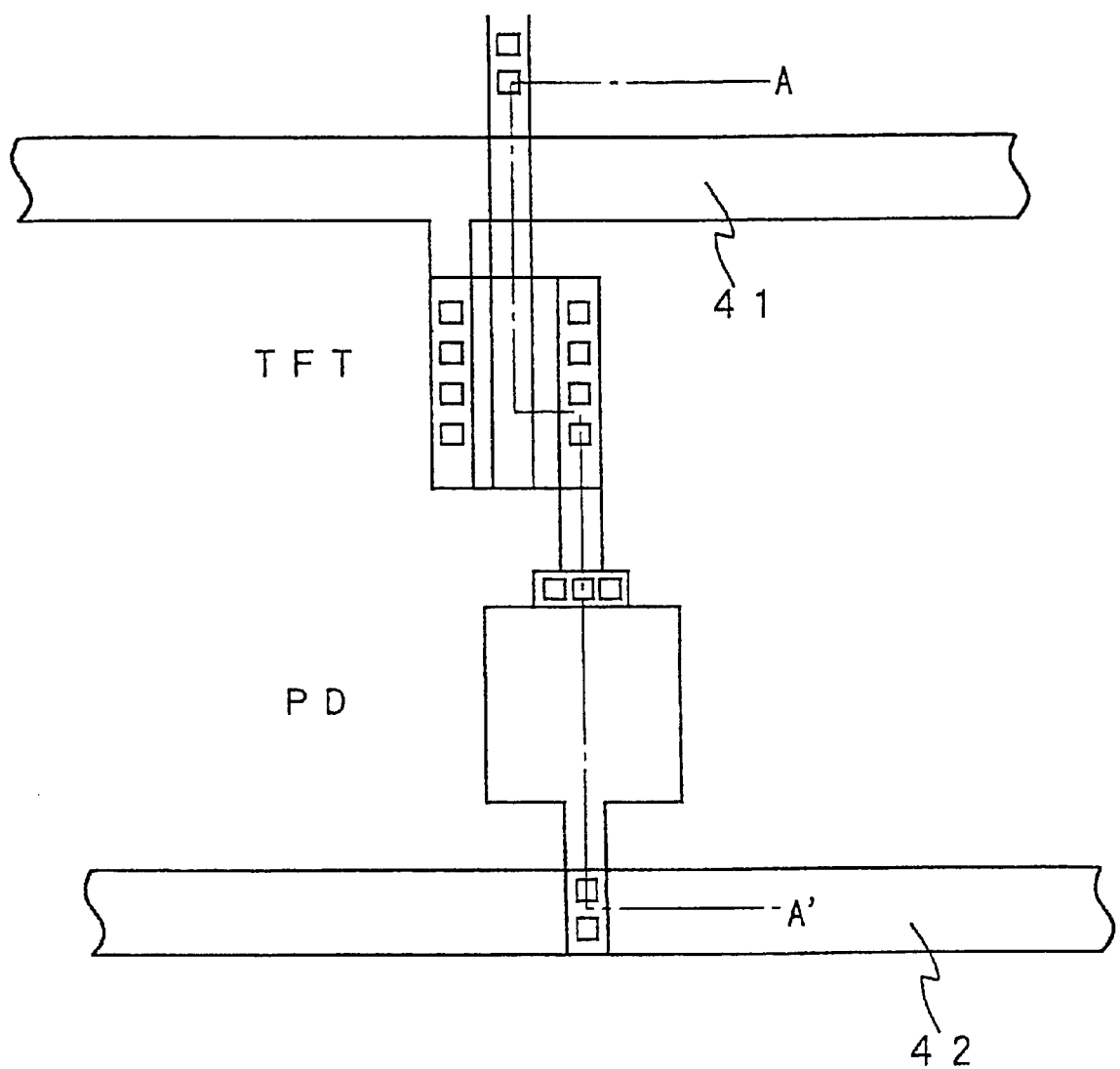
FIG. 3 is a schematic plan view of a pixel in an image sensor.

Finally, as illustrated in FIG. 2(d), a metal such as Al is deposited to a thickness of 500 to 1000 nm, which is then etched into a desired shape for an interconnection 13, and a passivation film is formed to give an image sensor.

Figure 4A:
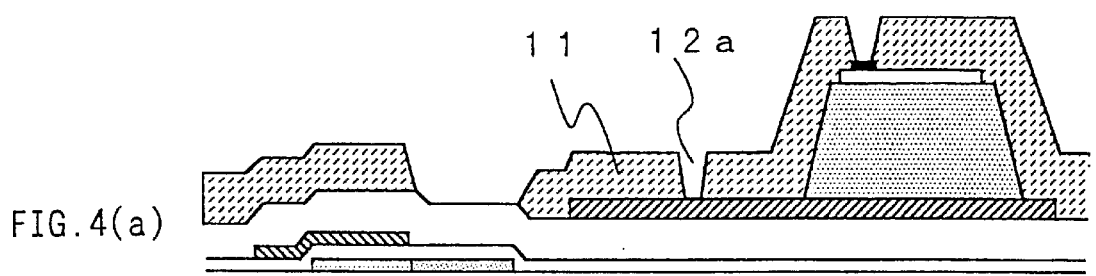
FIGS. 4((a) to (d)) is a process cross-section illustrating a process for manufacturing an image sensor according to a further embodiment of this invention.

When the gate electrode is formed with a metal, the second interlayer film may removed in the area where a contact to the source-drain is to be formed while forming a contact hole to the metal electrode in the PD; a contact hole may be formed to the gate electrode; and then a contact hole to the source-drain may be formed in the first interlayer film exposed in the area where the second interlayer film has been removed. Specifically, in the substrate for which the steps to formation of the second interlayer film 11 have been completed as described above, a contact hole 12a to the PD is formed in the second interlayer film 11 by dry-etching using $CF_4$ and $O_2$ as etchants as described above while removing the second interlayer film 11 over the area where the contact hole to the source-drain in the TFT is to be formed, as illustrated in FIG. 4(a).

Figure 4B:
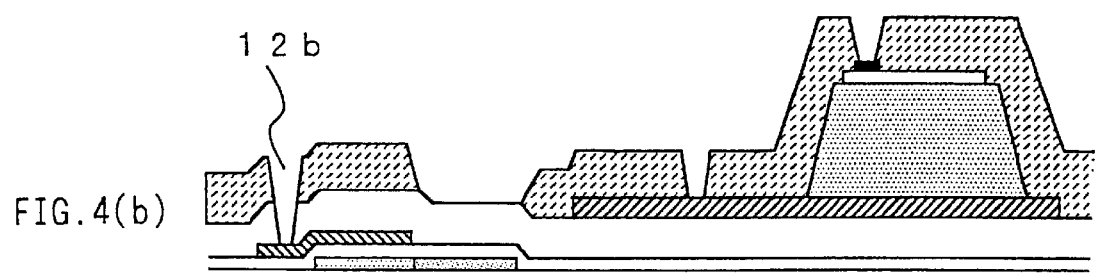
Figure 4C:
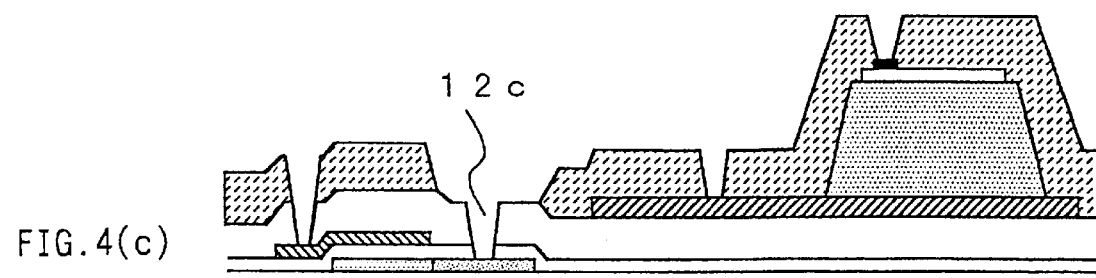

Then, covering the remaining areas with a mask such as a photoresist, the second and the first interlayer films 11, are sequentially dry-etched using $CF_4$ and $O_2$ as etchants for forming a contact 12b to the gate electrode (FIG. 4(b)). Then, dry etching is conducted while covering the areas except for the area where a contact hole 12c is to be formed, with a mask to form the contact hole 12c to the source-drain (FIG. 4(c)). It is preferable to use $CF_4$ and $H_2$ as etchants in such a mixture ratio that a selection ratio between the oxide film and polysilicon is increased, for further minimizing damage to the base polysilicon. There has been described a case that the contact hole to the gate electrode is formed before forming the contact hole to the source-drain. Instead, the contact hole to the source-drain can be formed before forming the contact hole to the gate electrode.

Figure 4D:
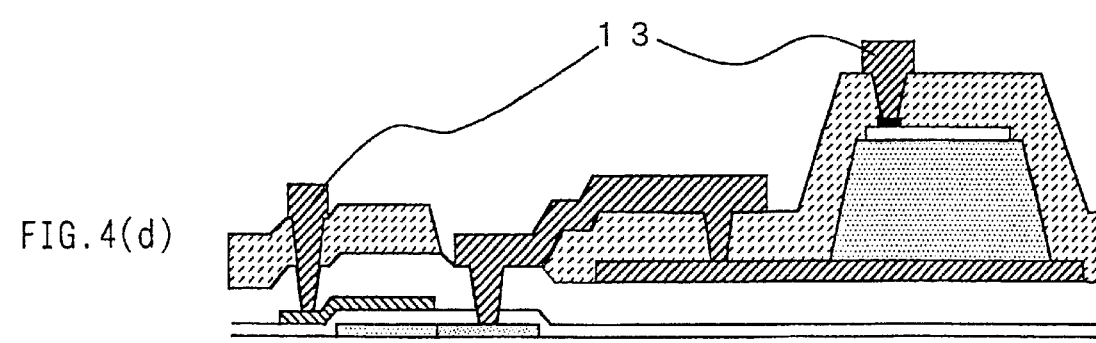
Figure 5A:
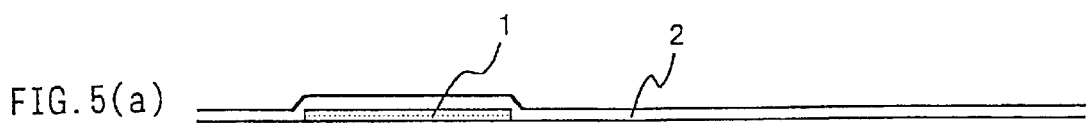
FIGS. 5((a) to (k)) is a process cross-section illustrating a process for manufacturing an image sensor according to the prior art.
Figure 5B:
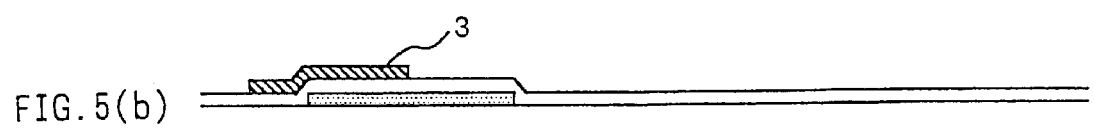
Figure 5C:
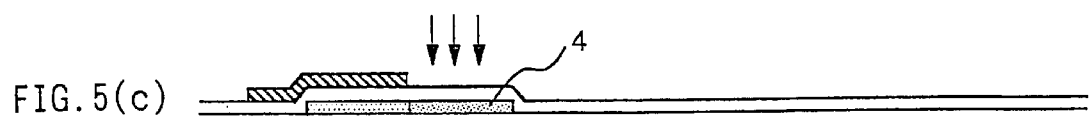
Figure 5D:
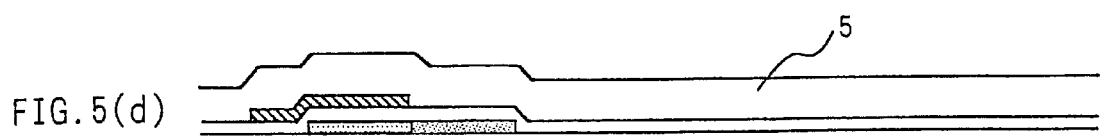
Figure 5E:
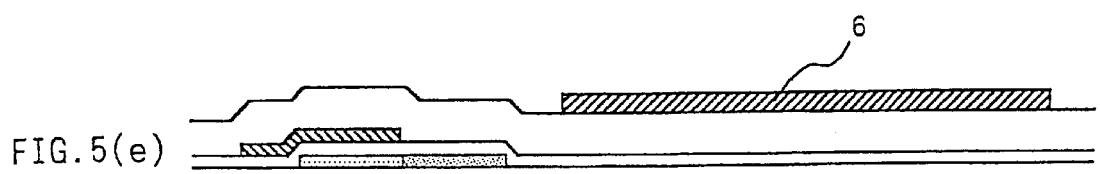
Figure 5F:
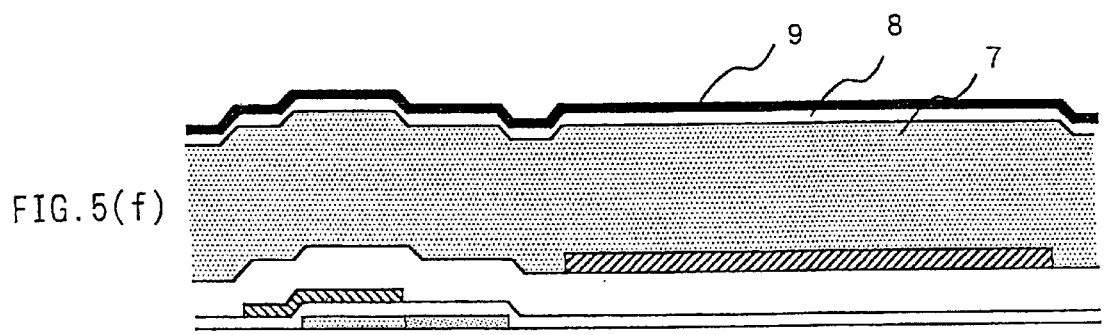
Figure 5G:
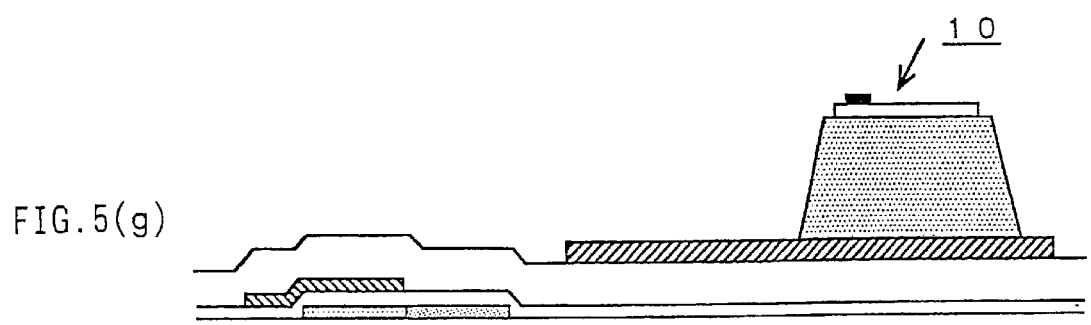
Figure 5H:
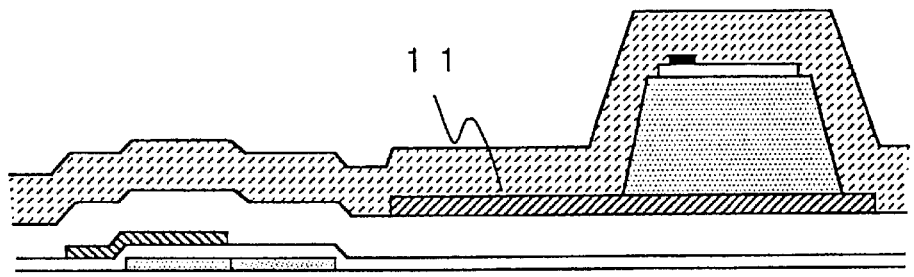
Figure 5I:
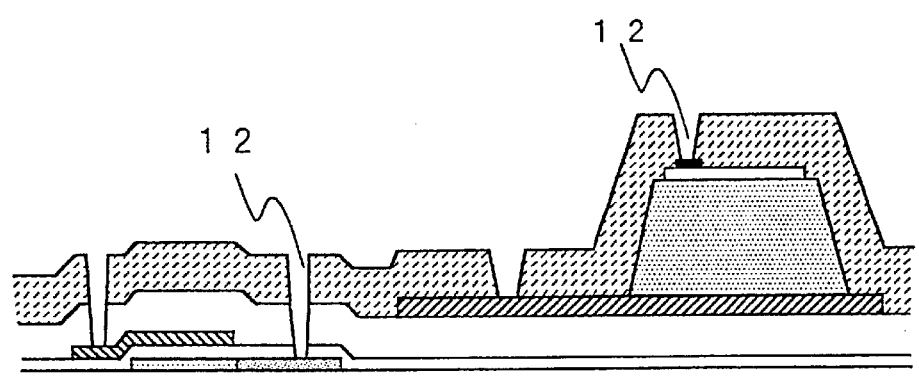
Figure 5J:
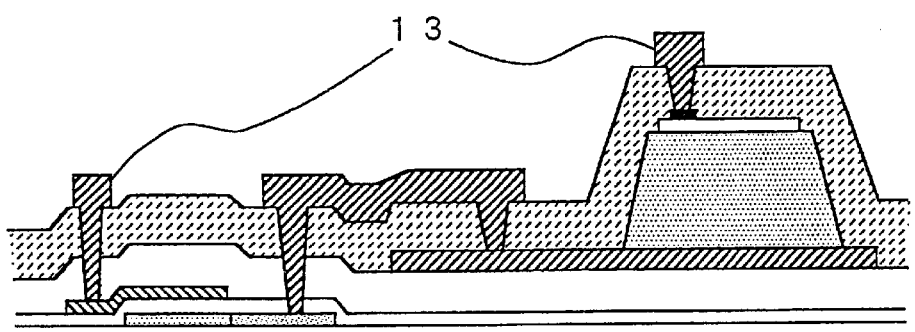
Figure 5K:
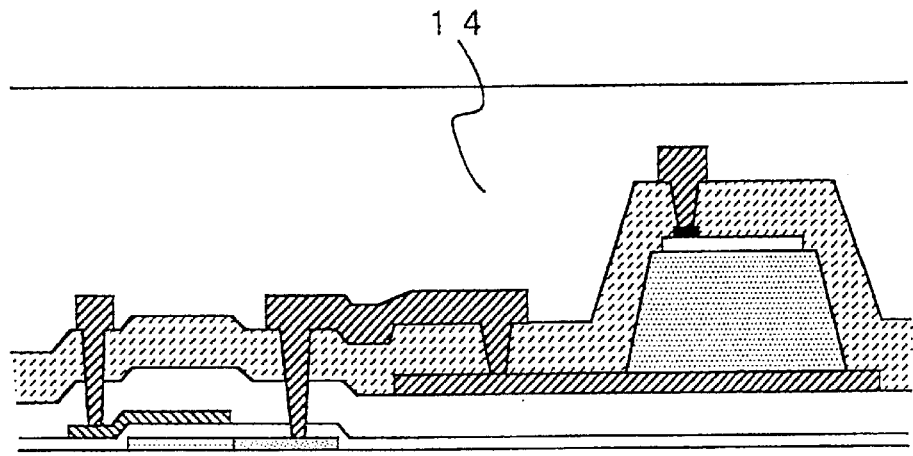
Figure 6A:
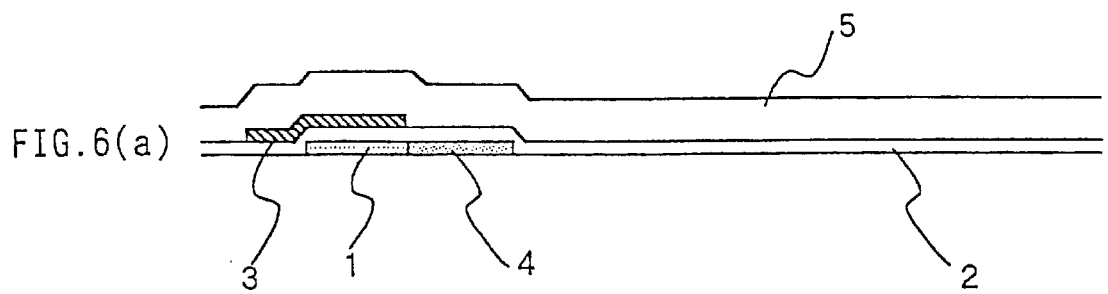
FIGS. 6((a) to (g)) is a process cross-section illustrating another process for manufacturing an image sensor according to the prior art.
Figure 6B:
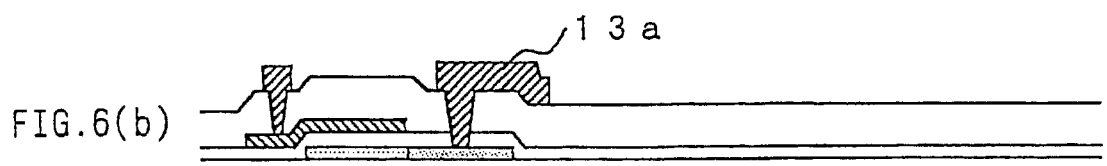
Figure 6C:
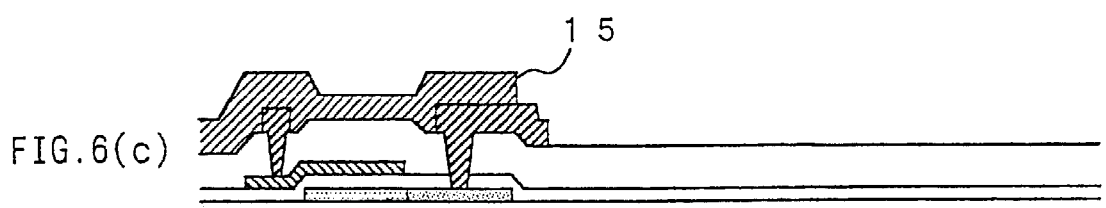
Figure 6D:
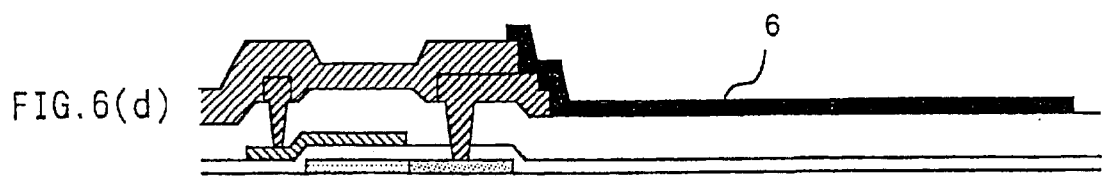
Figure 6E:
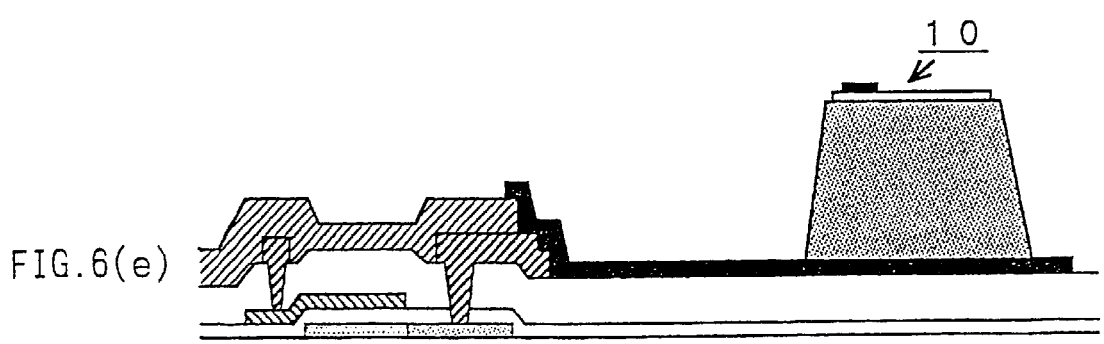
Figure 6F:
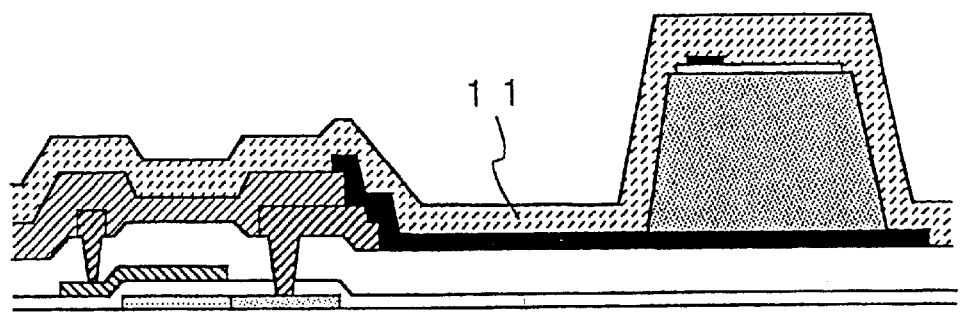
Figure 6G:
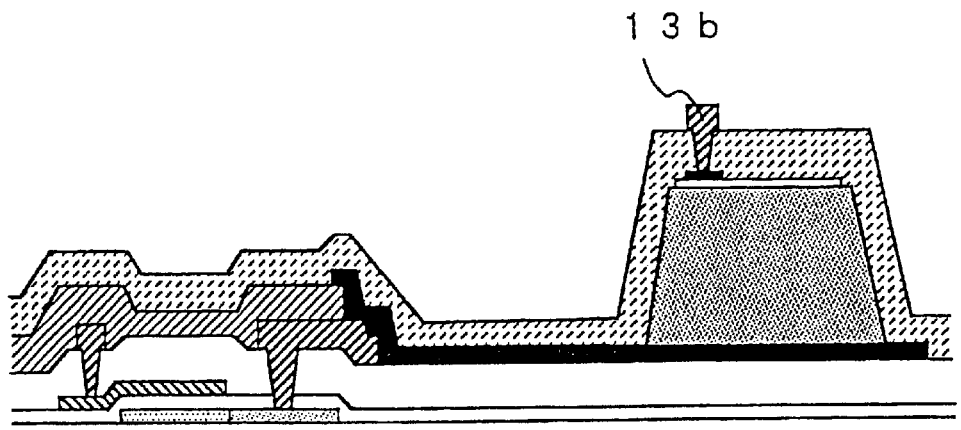

Finally, as illustrated in FIG. 4(d), a metal such as Al is deposited to a thickness of 500 to 1000 nm, which is then etched into a desired shape for an interconnection 13, and a passivation film is formed to give an image sensor.

There has been described a PD for a p-i-n junction amorphous silicon. This invention is, however, not limited to the particular type, and a configuration comprising a Schottky junction to i-a-Si may be employed. Furthermore, although there has been described only a TFT as a switching element to each pixel, this invention is not limited to the particular TFT. Thus, this invention may be applied to any type of TFT such as a resetting TFT and a driving circuit TFT as long as it can be covered by a layered structure consisting of the first and the second interlayer films during its manufacturing process.

What is claimed is:

1. An image sensor comprising:
   a thin film transistor (TFT) on top of a transparent substrate, said TFT having an electrical contact region;
   a first interlayer film covering said TFT;
   a photodiode (PD) having a lower electrode on said first interlayer film;
   a second interlayer film covering said PD and said lower electrode, said second interlayer film having a peripheral edge between said lower electrode and said TFT, said first and second interlayer films being different materials;
   a first contact hole that extends through said first interlayer film to said electrical contact region of said TFT;
   a second contact hole that extends through said second interlayer film to said lower electrode of said PD; and
   an electrical interconnection layer that extends through said first contact hole into contact with said electrical contact region, across a top surface of said first interlayer film, over said peripheral edge of said second interlayer film, and through said second contact hole into contact with said lower electrode,
   wherein an area on said top surface of said first interlayer film that is adjacent to said first contact hole is not covered by said second interlayer film, and
   wherein said electrical contact region is a source/drain region, wherein said TFT comprises a gate electrode, wherein a portion of said second interlayer film is over said gate electrode of said TFT, and further comprising a third contact hole that extends through said first and second interlayer films to said gate electrode.

2. The image sensor of claim 1, wherein said PD has a barrier metal layer on a top surface and further comprising a fourth contact hole that extends through said second interlayer film to said barrier metal layer.

3. The image sensor of claim 1, wherein said TFT is not covered by said second interlayer film.

4. The image sensor of claim 3, wherein said PD has a barrier metal layer on a top surface and further comprising a fourth contact hole that extends through said second interlayer film to said barrier metal layer.

5. The image sensor of claim 1, wherein said electrical interconnection layer directly contacts said top surface of said first interlayer film, directly contacts said peripheral edge of said second interlayer film, and directly contacts a top surface of said second interlayer film.

* * * * *